US005514967A

United States Patent [19]
Zelm

[11] Patent Number: 5,514,967
[45] Date of Patent: May 7, 1996

[54] AUTOMATIC INSULATION TEST EQUIPMENT FOR TESTING HIGH VOLTAGE ELECTRICAL EQUIPMENT AT THE RATED VOLTAGE LEVEL

[76] Inventor: Richard J. Zelm, P.O. Box 313, Lac Du Flambeau, Wis. 54538-0313

[21] Appl. No.: 291,411

[22] Filed: Aug. 16, 1994

[51] Int. Cl.[6] .................................................. G01R 31/02
[52] U.S. Cl. ............................................. 324/551; 324/772
[58] Field of Search .................................. 324/510, 523, 324/527, 551, 772; 361/30, 33, 23, 42; 340/647, 648, 650

[56] References Cited

U.S. PATENT DOCUMENTS

| | | | |
|---|---|---|---|
| 2,881,361 | 4/1959 | Wood | 324/510 |
| 2,999,189 | 9/1961 | Gerrard | 324/510 |
| 3,141,128 | 7/1964 | Behr | 324/510 |
| 4,338,561 | 7/1982 | Zaengl et al. | 324/551 |
| 4,679,111 | 7/1987 | Koch et al. | 361/42 |
| 4,709,293 | 11/1987 | Gershen et al. | 361/42 |
| 5,172,289 | 12/1992 | Zelm | 361/42 |
| 5,179,490 | 1/1993 | Lawrence | 361/42 |

Primary Examiner—Maura K. Regan
Attorney, Agent, or Firm—Pravel, Hewitt, Kimball & Krieger

[57] ABSTRACT

Insulation test equipment for testing high voltage electrical equipment at rated voltage levels up to above 5 kV. A multistage rectifier-capacitor voltage multiplier ladder is used to boost the test voltage to the desired level, while keeping the current and load capacity to a safe, low level. If an appreciable amount of current is attempted to be drawn, such as might occur with accidental human contact, the rectifier—capacitor ladder breaks down to limit the voltage and current to safe levels. Two separate current limit resistors are provided for both outgoing and incoming voltages of the test equipment. One is installed in the test apparatus and the other is installed on the high voltage fuse at the contact point between the motor windings and the test lead. The voltages and insulation current generated by the test equipment are monitored indirectly through opto-coupler circuits to isolate and protect the monitoring circuits and the operator.

8 Claims, 4 Drawing Sheets

AUTOMATIC INSULATION TEST EQUIPMENT FOR TESTING HIGH VOLTAGE ELECTRICAL EQUIPMENT AT THE RATED VOLTAGE LEVEL

BACKGROUND OF THE INVENTION

1. Field of the Invention

The present invention relates to insulation test equipment for testing high voltage electrical equipment at the rated voltage level while limiting the maximum output current to a safe level.

2. Description of the Prior Art

Motors and generators are used in many industries and institutions. Offshore drilling rigs typically have one or more generators to meet their power requirements, as well as motors to perform various tasks on the rigs. Hospitals often have backup generators for use in the event of a power outage. Such motors and generators operate at relatively high power and voltage levels. For example, the voltage ratings of the motors are typically 250 V, 500 V, 1 kV and 5 kV. This electrical equipment is expensive and must be properly maintained, inspected and tested periodically to assure safe and reliable operation.

A common cause of malfunctioning of electrical motors and generators is inadequate insulation of the wiring. Such inadequate insulation may be due, for example, to manufacturing defects of the wiring, shorts introduced during manufacture of the equipment, or breakdown of the insulation. Generally, breakdown of the insulation typically occurs when the equipment is idle. Common causes of insulation breakdown, in addition to thermal aging, include the presence of moisture, oil, grease, chemical fumes and airborne contaminants. If the equipment is not tested each time before it is run, the testing may be useless because, if the insulation breakdown is serious enough, the equipment may fail and even explode on start-up.

The insulation resistance can be measured directly by opening the motor or generator, applying a DC voltage to the wires, and measuring the current which flows to ground. This manual method of insulation monitoring is time consuming and, therefore, is not performed as often as it should be. The inevitable result is that insulation breakdown goes undetected, and is often not discovered until a motor or generator fails when it is started at great expense to its owner.

Automatic insulation resistance testers have been built and used for testing electrical equipment having voltage ratings up to 500 volts. U.S. Pat. No. 5,155,441 discloses an automatic insulation tester for periodically testing a plurality of motors or generators. A related patent, U.S. Pat. No. 5,172,289, discloses an automatic insulation tester using a ground interrupter to interrupt the normal ground circuit of the electrical equipment before it is tested for insulation breakdown. The operation of the insulation testers in these two patents is similar. When the electrical equipment is not operating, the insulation tester automatically checks the equipment and disables the starting mechanism if the equipment is not safe to be operated. The insulation tester uses relay logic to disable itself while the motor or generator is operating. Typically, a potential transformer is connected to two of the input lines to provide power to an insulation tester. A low-voltage power supply converts the sinusoidal line voltages to a low DC voltage, which is provided to a "high" voltage switching power supply. The high voltage switching power supply typically uses a high impedance isolator circuit and a four to one voltage amplifying transformer to develop the rated voltage level of about 500 volts DC.

The 500 volts DC, which is the rated voltage level of the equipment to be tested, is applied between the windings and ground to determine the leakage current through the insulation of the windings on a three phase motor. The leakage current is used to derive the insulation resistance, which is displayed to the operator during the test. The insulation testers further include latch circuitry to disable the motor starter if the impedance or resistance of the insulation falls below a predetermined low level. Once the insulation resistance test fails, the equipment may only be started after increasing the insulation resistance and resetting the test equipment. Simply resetting the test equipment will not allow operation. Thus, the motor or generator is tested at its rated voltage level of 500 volts while idle to assure safe operation before starting.

Many problems have been encountered when attempting to apply the same principles in developing insulation test equipment for motors or generators having voltage ratings above 500 volts. It is possible to provide a high impedance oscillator to drive a transformer having ten times the number of windings to develop the voltage level necessary to test electrical equipment having ten times the rated voltage level. Or, several transformer stages could be serially linked to develop the necessary voltage levels. Even though such test equipment could be designed, the test equipment would also be capable of driving a significant amount of current, which could easily injure or even kill a human operator upon accidental contact. Such equipment is simply too dangerous to be used by or near humans.

As a result, the automatic insulation test equipment available today for measuring insulation resistance tests the high voltage electrical equipment at a much lower voltage level than the rated voltage level, to assure safety. This technique is not desirable, since it is based upon the incorrect assumption that there is a linear relationship between the voltage applied and the current measured through the insulation. This assumption is inaccurate and often provides faulty data, which could be hazardous if a fault condition truly exists. It is known that tests using voltage levels substantially below the rated voltage levels tend to inspire confidence which may not be justified. It is believed that a test which does not stress the insulation at or greater than the service potential is a waste of time and money. If there are no problems, the lower or higher test voltages may reveal nothing. However, the higher test voltages reveal latent weaknesses that the lower test voltages will miss. Nonetheless, lower voltage test equipment is commonly used to test equipment having higher rated voltage levels, since no other method has been practical.

Therefore, it is desirable to provide a safe and reliable means for automatically measuring insulation resistance of high voltage electrical motors and generators at or above the rated voltage level.

SUMMARY OF THE PRESENT INVENTION

An automatic high voltage insulation tester according to the present invention includes a multistage voltage multiplier circuit and a high voltage rating transformer to achieve testing at or above the rated voltage level of high voltage electrical equipment, while also maintaining a low current and low load capacity for safe operation. A high impedance oscillator drives a transformer to provide an intermediate voltage level. The transformer drives a multistage diode-capacitor voltage multiplier ladder to amplify the output of the transformer to the desired rated voltage level, which can be up to 5 kV. The transformer is designed with extra insulation for the higher voltage rating to prevent failure. However, the voltage output of the multistage multiplier collapses to a safe level if any appreciable current is drawn. Thus, a relatively high load suddenly placed across the high voltage output, such as might occur in the event of human contact, causes the voltage to collapse to a lower, safer voltage level.

Current limit protection is provided to further protect operators from high voltages provided by both the electrical equipment and the test apparatus. The typical current limit resistor provided in prior designs is split into two separate resistors. One is installed within the test apparatus and the other is installed on the high voltage fuse at the contact point between the windings of the electrical equipment and the test lead. This protects the operator from excessive currents in the event of short circuit or other malfunction, which would otherwise expose the operator to the high voltage and current levels. Also, the test equipment is protected from accidental contact with high powered bus lines. The voltage and insulation current generated by the test equipment are monitored indirectly using opto-coupler circuits having high dielectric ratings, so that the high voltage is completely isolated from the low-voltage monitoring circuits, and ultimately, the operator.

In this manner, an insulation tester according to the present invention is capable of testing high voltage electrical equipment at rated voltage levels up to 5 kV, while at the same time limiting the maximum current and load capability to safe levels. Thus, an apparatus according to the present invention provides for a more accurate and reliable measurement of the insulation resistance of high voltage electrical equipment, while maintaining appropriate safety precautions.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
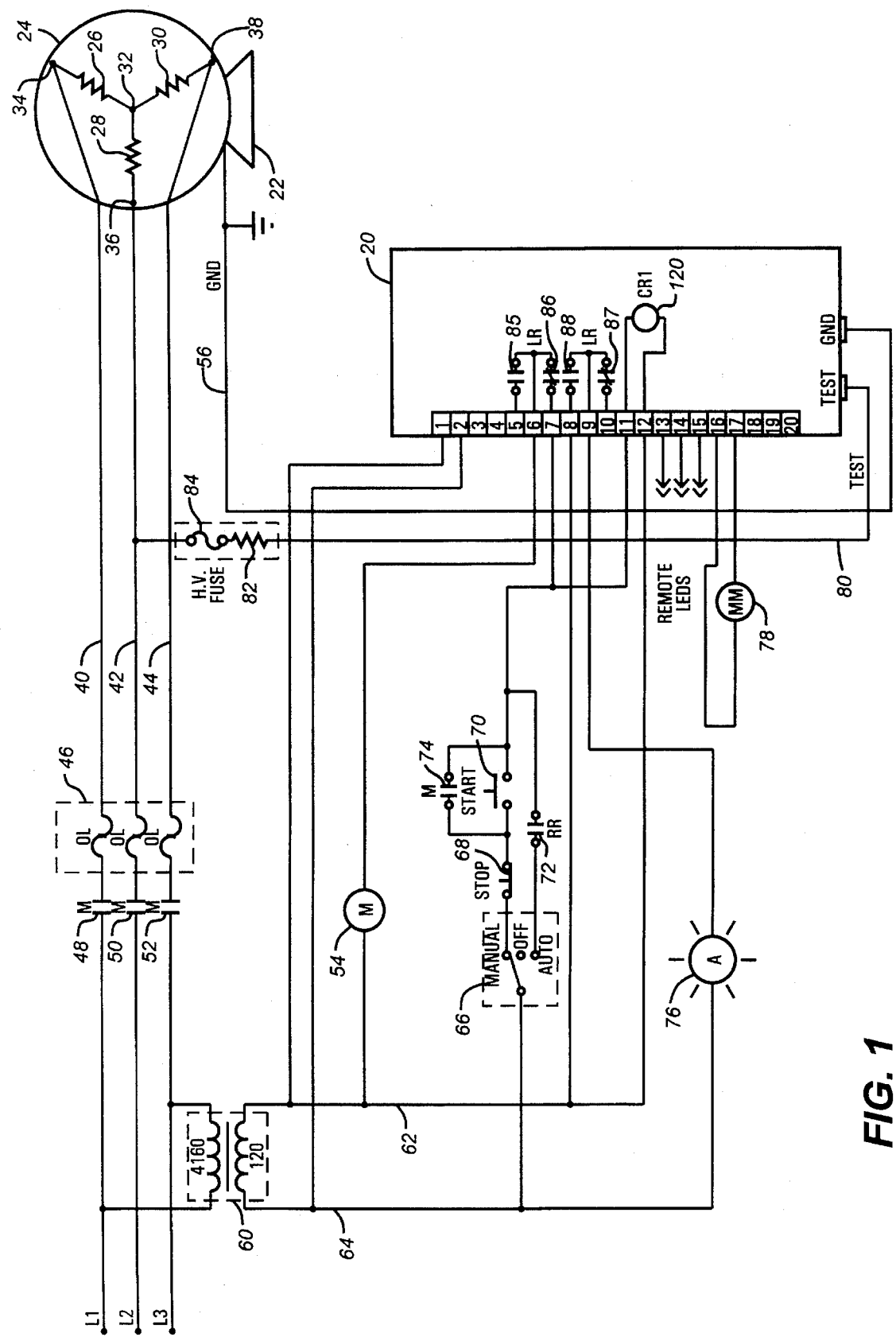
FIG. 1 is a simplified schematic diagram showing an automatic insulation tester according to the present invention connected to electrical equipment to be tested.

Referring now to FIG. 1, an automatic insulation tester 20 according to the present invention is shown connected to electrical equipment comprising a three phase motor 22 having a chassis 24 and three windings 26, 28 and 30. The motor 22 preferably has a voltage rating of approximately 5 kilovolts (kV). The windings 26, 28 and 30 are connected at a common center junction 32 and each winding includes corresponding winding terminals 34, 36 and 38, respectively. The winding terminals 34, 36 and 38 are electrically connected through power lines 40, 42 and 44, respectively, to a circuit breaker 46, which includes three separate internal fuses for each of the lines 40, 42 and 44. The other ends of the fuses within the circuit breaker 46 are connected to one end, respectively, of three normally-open motor relay contacts 48, 50 and 52, having their other ends connected to power bus lines L1, L2 and L3, respectively. The chassis 24 of the motor 22 is connected to ground through a ground line 56. It is understood that the motor 22 may alternatively be a generator driven by an engine (not shown) for providing power on the bus lines L1, L2 and L3. However, the motor 22 is shown for purposes of illustration and simplicity.

The motor relay contacts 48, 50 and 52 are controlled by a motor starter 54, so that when the motor starter 54 is activated, the motor relay contacts 48, 50 and 52 are closed. When the contacts 48, 50 and 52 are closed, power from bus lines L1, L2 and L3 is provided through lines 40, 42 and 44 to the respective windings 26, 28 and 30 to activate the motor 22. When current no longer flows through the starter 54 so that it is de-activated, the contacts 48, 50 and 52 are opened. Each of the bus lines L1, L2 and L3 preferably provide a voltage of approximately 2,400 volts and have a phase differential of 120° with respect to each other, so that root-mean-square (RMS) voltage between any two of the bus lines L1, L2 and L3 is approximately 4,160 volts. It is desirable, therefore, to test the resistance of the insulation (not shown) of the motor 22 using a voltage of at least 4,160 volts, and preferably at 5 kV.

A control potential transformer 60 has a primary winding connected between the bus lines L1 and L3 for providing a 120 volt low current sinusoidal output between lines 62 and 64 at its secondary. Thus, the control potential transformer 60 is a step-down isolation transformer for providing power to the tester 20, where line 62 is connected to terminal 1 and line 64 is connected to terminal 2 of the tester 20. Line 62 is also connected to one side of the motor starter 54, having its other side connected to terminal 6 of the tester 20. Line 64 is connected the control arm of a single-pole, triple-throw switch 66, which switches between off, manual and automatic (auto) operation. A manual pole for manual operation of the switch 66 is connected to one side of a normally-closed push-button stop switch 68, which has its other side connected to the first side of a normally-open push-button start switch 70. An auto pole for automatic operation of the switch 66 is connected to one side of a normally-open relay contact 72 of a remote start relay (not shown), where the other side of the contact 72 is connected to the second side of the start switch 70. A normally-open relay contact 74 is connected in parallel across the start switch 70 and is controlled by the motor starter 54 in a similar manner as the contacts 48, 50 and 52. The second side of the start switch 70 is connected to terminals 7 and 11 of the tester 20.

Line 62 is also connected to terminals 8 and 12 of the tester 20, and line 64 is connected to one side of a remote alarm 76, which has its other side connected to terminal 9 of tester 20. Terminals 13 and 15 of the tester 20 are connected to remote light emitting diodes (LEDs) 158, 164 (FIG. 3), which will be described further below. A megohm meter 78 is connected between terminals 16 and 17 of the tester 20. The tester 20 has a high voltage output test line 80, providing a signal TEST, which is connected to one side of a resistor 82, having its other side connected to one side of a high voltage fuse 84. The other side of the fuse 84 is connected to the power line 42. The tester 20 also has a ground terminal connected to line 56, which is grounded through a signal GND. Within the tester 20, two normally-closed relay contacts 86 and 87 are connected between terminals 6 and 7 and between terminals 9 and 10, respectively, and two normally-open relay contacts 85 and 88 are connected between terminals 5 and 6 and between terminals 8 and 9, respectively, of the tester 20. The contacts 85–88 will be described further below. Also, a normally-open relay contact 252 (FIG. 4) is coupled between the TEST terminal and the high voltage output of the tester. The contact 252 is controlled by an isolating relay coil 374 (FIG. 5) which is controlled by a normally closed contact 372 (FIG. 5) controlled by a relay coil 120 coupled between terminals 11 and 12 of the tester 20. The contact 252 changes to closed when power is applied to terminals 1 and 2 of tester 20, until current flows through the coil 120.

To activate the motor 22, the start switch 70 is pressed while the switch 66 is in the manual position connecting power through closed contact 86 to the motor starter 54, thereby closing the contacts 48, 50, 52 and 74. The motor 22 receives power from the bus lines L1, L2 and L3 through the contacts 48, 50 and 52, and the closure of the contact 74 maintains power to the motor starter 54 after the start switch 70 is released. The motor 22 may be stopped by pressing the stop switch 68 or by switching the switch 66 to the off position. The motor 22 may also be started when the switch 66 is in the auto position by activating the remote start relay, closing the contact 72. The motor 22 may be stopped in automatic mode by deactivating the remote start relay, which opens the contact 72, or by switching the switch 66 to the off position. While the motor 22 is receiving power, the coil 120 is activated and opens the contact 372 which returns contact 252 to normally open and opens a normally-closed relay contact 118 (FIG. 3) to assure that the tester 20 will not operate while the motor 22 is running. The contact 118 operates identical to the contact 372 which is controlled by the coil 120. When the coil 120 no longer receives current, it is de-activated and closes the contacts 118 and 372, which causes contact 252 to close.

Figure 2:
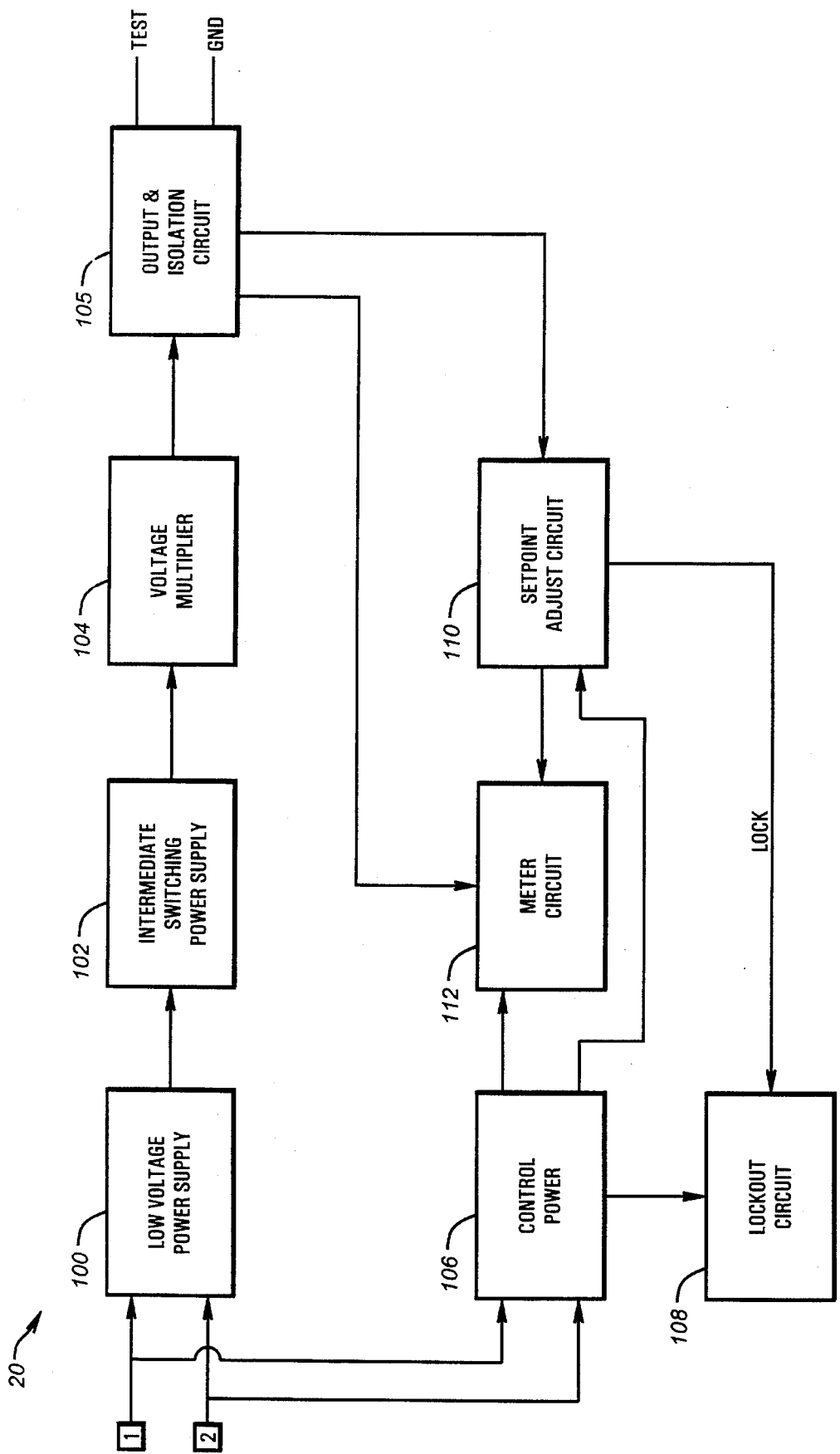
FIG. 2 is a simplified block diagram of the automatic insulation tester of FIG. 1.

Referring now to FIG. 2, a simplified block diagram of the tester 20 is shown. The block diagram is simplified to provide a functional overview of the tester 20, where portions of the detailed circuitry are omitted for clarity. The detailed circuitry will be described below. In general, an AC signal of 120 volts or 240 volts, or a DC signal of 24 volts is provided between terminals 1 and 2 of the tester 20, to a low-voltage power supply 100. The low-voltage power supply 100 drives an intermediate switching power supply 102, which provides its output to a voltage multiplier 104. An output and isolation circuit 105 provides the TEST, and GND output signals of the tester 20, and also provides several feedback signals to a setpoint adjust circuit 110 and a meter circuit 112. The setpoint adjust circuit 110 allows adjustment of a resistance value necessary to trigger a fault condition. Usually, this value of resistance is predetermined and is set slightly above the value at which damage could occur to the motor 22. If the fault condition occurs, the setpoint adjust circuit 110 asserts a signal LOCK to a lockout circuit 108, which prevents the motor 22 from being started. The meter circuit 112 provides the necessary drive circuitry to drive the meter 78, and also to provide an isolated control signal to other resistance display circuitry (not shown), such as a remote meter or computer interface. A low-voltage power supply 106 provides power to the lockout circuit 108, the set point adjust circuit 110 and the meter circuit 112.

Figure 3:
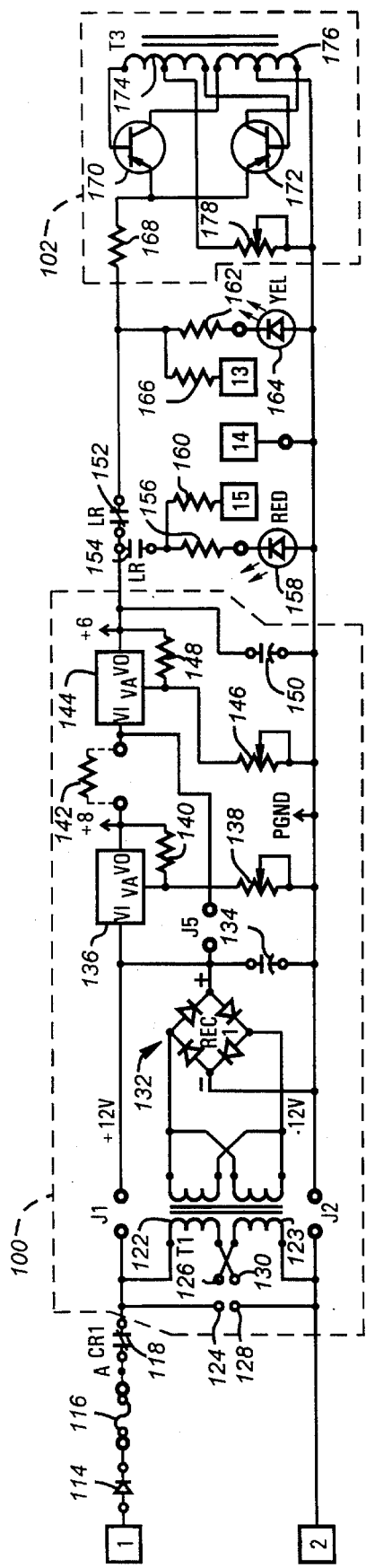
FIG. 3 is a more detailed schematic diagram of the low and intermediate voltage power supply portions of the automatic insulation tester of FIG. 1.

Referring now to FIG. 3, a more detailed schematic diagram is shown of the low voltage and the intermediate switching power supplies 100, 102. Terminal 1 of the tester 20 is connected to the anode of a diode 114, having its cathode connected to one side of a fuse 116. The other side of the fuse 116 is a signal A, which is connected to one side of the contact 118, having its other side connected to the positive side of the low-voltage power supply 100. Terminal 2 of tester 20 is connected to the negative terminal of the low-voltage power supply 100. The positive and negative input terminals of the low-voltage power supply 100 are each connected to terminals 124, 128, respectively, and also to one side of primary coils 122, 123, respectively, of a transformer T1. Two terminals 126 and 130 are connected to the other sides of the primary coils 123, 122, respectively, of the transformer T1. As known to those skilled in the art, a jumper may be provided between terminals 124 and 126 and between terminals 128 and 130 if a sinusoidal input voltage of 120 volts AC is provided between terminals 1 and 2 of the tester 20. Alternatively, a single jumper may be provided between terminals 126 and 130 if an AC voltage of 240 volts is provided at the input terminals 1 and 2.

The secondary of the transformer T1 is provided to the input terminals of a fullwave bridge rectifier 132, having its negative output terminal connected to a −12 V signal and its positive output terminal connected to a +12 V signal. A bulk capacitor 134 is connected between the +12 V and −12 V signals. The transformer T1 and rectifier 132 converts an AC voltage of 120 or 240 volts to a 12 volt DC signal between the +12 V and −12 V signals, so that the +12 V and −12 /V signals are actually at +6 and −6 volts or +12 volts and local ground. Alternatively, a jumper J1 may be connected between the positive input terminal of the low-voltage power supply 100 and the +12 V signal, and a jumper J2 may be connected between the minus terminal of the low-voltage power supply 100 and the −12 V signal, to bypass and eliminate the transformer T1 and the rectifier 132, if a 24 volt DC voltage is applied at terminals 1 and 2 of the tester 20. In either case, the −12 V signal serves as a local ground, and will be referred to as a signal PGND.

If the 24 volt DC input option is used, the +12 V signal is provided to the input terminal of a three terminal voltage regulator 136, having an adjust terminal connected to one side of a variable resistor 138. The other side of the resistor 138 is connected to PGND and a feedback resistor 140 is connected between the output and the adjust terminals of the regulator 136. The variable resistor 138 includes a control arm to control its resistance and to adjust the output of the regulator 136, which preferably provides an output of approximately 12 volts with respect to PGND. The output of the regulator 136 is connected to one side of an optional resistor 142, having its other side connected to the input of another three terminal voltage regulator 144. The adjust terminal of the regulator 144 is connected to one side of a variable resistor 146, having its other side connected to PGND. A feedback resistor 148 is connected between the output and the adjust terminal of the regulator 144. A filter capacitor 150 is connected between the output of the regulator 144 and PGND. The variable resistor 146 also includes a control arm to vary its resistance and to adjust the output of the regulator 144 to a voltage of approximately 6 volts with respect to PGND. Alternatively, if the AC voltage option is utilized, a jumper J5 may be connected between the +12 V signal and the input of the regulator 144 and the resistor 142 may be omitted along with the regulator 136.

The output of the regulator 144, which is the output of the low-voltage power supply 100, is connected to one side of a normally-closed relay contact 152, having its other side connected to the positive input of the intermediate power supply 102. The output of the regulator 144 is also connected to one side of a normally-open relay contact 154, having its other side connected to one side of a resistor 156 and to one side of a resistor 160. The contacts 152 and 154 are latching relay contacts controlled by the latching relay coil 370 (FIG. 5) and a reset relay coil 368, described below. The other side of the resistor 156 is connected to the cathode of a red LED 158, having its anode connected to PGND. The other side of the resistor 160 is connected to terminal 15 of the tester 20. The positive input of the intermediate power supply 102 is connected to one side of a resistor 162 and to one side of a resistor 166. The other side of the resistor 162 is connected to the cathode of a yellow LED 164, having its anode connected to PGND. The other side of the resistor 166 is connected to terminal 13 of the tester 20. The negative input of the intermediate power supply 102 is connected to PGND.

The intermediate power supply 102 includes a resistor 168, having one side receiving the positive input of the intermediate power supply 102, and its other side connected to the emitter terminals of two PNP bi-polar transistors 170 and 172. The base of the transistor 170 is connected to one side of a first primary coil 174 of a transformer T3. The other side of the primary coil 174 is connected to the base of the transistor 172. The collector of the transistor 170 is connected to one side of a second primary coil 176 of the transformer T3, where the other side of the coil 176 is connected to the collector of the transistor 172. Both of the coils 174, 176 have center tap junctions, where the center tap of the coil 174 is connected to one side of a variable resistor 178, which has its other side connected to PGND. The center tap of the coil 176 is connected to PGND. The transistors 170, 172, the resistors 168, 178 and the primary coils 174 and 176 of the transformer T3 comprise a high impedance oscillator, which converts the output of the low-voltage power supply 100 to a voltage of approximately 500 volts across a secondary coil 180 (FIG. 4) of the transformer T3. The secondary coil 180 is the input portion of the voltage multiplier 104. Although the transformer provides an output of only 500 volts, it is preferably insulated to 5 kV, because of the voltage multiplying function of the voltage multiplier 104. Initial development tests were performed with an output insulation rating of 500 V, but the insulation soon broke down, resulting in failure of the transformer T3. By insulating the transformer T3 to 5 kV, as produced by the voltage multiplier 104, this breakdown and failure has been eliminated.

Figure 4:
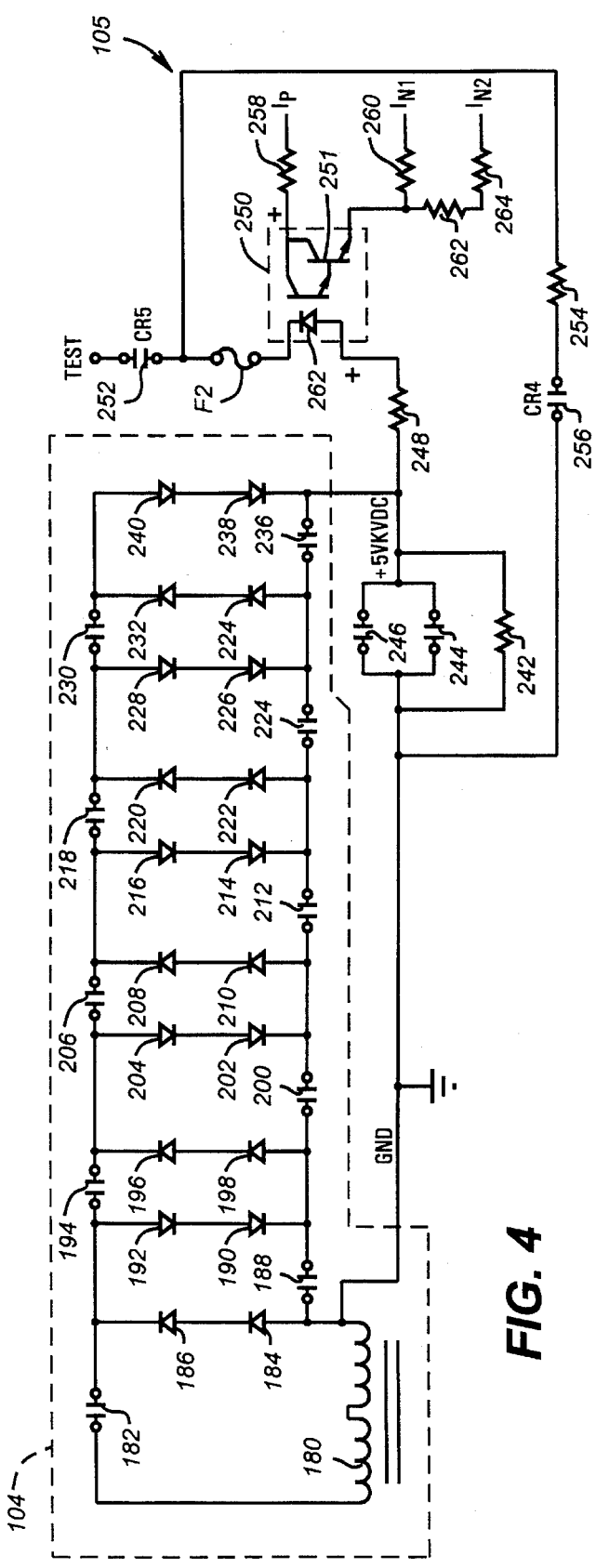
FIG. 4 is a more detailed schematic diagram of the voltage multiplier portion of the automatic insulation tester of FIG. 1.

Referring now to FIG. 4, a more detailed schematic diagram of the voltage multiplier 104 and the output circuit 105 is shown. One side of the secondary coil 180 is connected to one side of a capacitor 182 and the other side of the coil 180 is connected to GND and to the anode of a diode 184. The cathode of the diode 184 is connected to the anode of another diode 186, which has its cathode connected to the other side of the capacitor 182. The capacitor 182 and the diodes 184, 186 form the first stage of the voltage multiplier 104. The anode of the diode 184 is connected to one side of a capacitor 188, having its other side connected to the cathode of a diode 190. The anode of the diode 190 is connected to the cathode of a diode 192, which has its anode connected to the cathode of the diode 186. This completes the second stage of the voltage multiplier 104. The anode of the diode 192 is connected to one side of a capacitor 194, where the other side of the capacitor 194 is connected to the cathode of a diode 196. The anode of the diode 196 is connected to the cathode of a diode 198, which has its anode connected to the cathode of the diode 190. This completes the third stage. One side of a capacitor 200 is connected to the anode of the diode 198, where the other side of the capacitor 200 is connected to the cathode of a diode 202, which has its anode connected to the cathode of a diode 204, which has its anode connected to the cathode of the diode 196. This completes the fourth stage. One side of a capacitor 206 is connected to the anode of the diode 204, and the other side of the capacitor 206 is connected to the cathode of a diode 208. The anode of the diode 208 is connected to the cathode of a diode 210, having its anode of connected to the cathode of the diode 202, completing the fifth stage.

One side of a capacitor 212 is connected to the cathode of the diode 202, and the other side of the capacitor 212 is connected to the cathode of a diode 214. The anode of the diode 214 is connected to the cathode of a diode 216, having its anode connected to the cathode of the diode 208, completing the sixth stage. One side of a capacitor 218 is connected to the cathode of the diode 208, and the other side of the capacitor 218 is connected to the cathode of a diode 220, having its anode connected to the cathode of a diode 222. The anode of the diode 222 is connected to the cathode of the diode 214, completing the seventh stage. One side of a capacitor 224 is connected to the cathode of the diode 214, and the other side of the capacitor 224 is connected to the cathode of a diode 226, having its anode connected to the cathode of a diode 228. The anode of the diode 228 is connected to the cathode of the diode 220, completing the eighth stage. One side of a capacitor 230 is connected to the cathode of the diode 220, and the other side of the capacitor 230 is connected to the cathode of a diode 232, having its anode connected to the cathode of a diode 224. The anode of the diode 224 is connected to the cathode of the diode 226, completing the ninth stage. One side of a capacitor 236 is connected to the cathode of the diode 226, and the other side of the capacitor 236 is connected to the cathode of a diode 238, having its anode connected to the cathode of a diode 240. The anode of the diode 240 is connected to the cathode of the diode 232, completing the tenth and final stage of the voltage multiplier 104.

Operation of the voltage multiplier 104 is as follows. One side of the secondary coil 180 is connected to GND, so that its other side connected to the capacitor 182 oscillates between −500 and +500 volts. The capacitor 182 thus charges through the diodes 184 and 186 to a positive 500 volts with respect to the cathode of the diode 186, which oscillates between 0 and 1,000 volts following the secondary coil 180. When this voltage rises to 1,000 volts, adding the voltage of the secondary coil 180 and the voltage across the capacitor 182, the diodes 190, 192 conduct to eventually charge the capacitor 188 to about 1,000 volts. When the cathode of the diode 186 drops back to 0 volts, the capacitor 188 eventually charges the capacitor 194 through the diodes 196, 198 to about 1,000 volts. In a similar manner, the capacitors 206, 218 and 230, and the capacitors 200, 212, 224 and 236 all charge to 1,000 volts. The voltages of the capacitors 188, 200, 212, 224 and 236 add to total 5 kV. The cathode of the diode 238 provides the high voltage output of the voltage multiplier 104, which is preferably approximately 5 kVDC with respect to the GND terminal of the tester 20. This will be referred to as the +5 kVDC signal.

The diodes 184–240 and the capacitors 182–236 are chosen to withstand the voltage levels for each stage, but are implemented so as not to drive a significant amount of current. If a significant amount of current is attempted to be drawn, the capacitors 188, 194, 200, 206, 212, 218, 224, 230 and 236 discharge quickly, so that the voltage of the voltage multiplier 104 collapses quickly down to about 500 volts.

The +5 kVDC signal is connected to one side of a load resistor 242, to one side of a filter capacitor 244 and to one side of another filter capacitor 246. The other sides of the load resistor 242 and the capacitors 244 and 246 are connected to GND. The +5 kVDC signal is also connected to one side of a current limit resistor 248, having its other side connected to the anode of an LED 249 of an opto-coupler 250. The cathode of the LED 249 of the opto-coupler 250 is connected to one side of a fuse F2, which has its other side connected to one side of a normally-open isolation relay contact 252. The contact 252 is controlled by a relay coil 374 (FIG. 5), so that while current flows through the coil 374, the contact 252 changes state to closed. The other side of the contact 252 provides the TEST output signal of the tester 20.

If the motor 22 is not operating and the coil 120 is not activated, the contacts 152 and 118 allow an input voltage between terminals 1 and 2 of the tester 20 to be multiplied to an output voltage of approximately 5 kVDC between the TEST and ground terminals. The yellow LED 164 receives current and is illuminated. The TEST output is provided between the windings 26, 28 and 30 of the motor 22 and GND. If a dead short of the insulation resistance of the motor 22 occurs during testing, the multiple stages of the voltage multiplier 104 would collapse to allow a maximum output current of approximately 350 microamps (μA). Otherwise, the higher the insulation resistance, the lower the current provided through the opto-coupler 250. Current limit resistance between the tester 20 and the motor 22 is split into the two resistors 248 and 82. If all of the current limit resistance was provided in the tester 20, an operator may potentially be exposed to the high voltages of the bus lines L1, L2 and L3. Or, if the resistor 82 was the only current limit resistance, an operator could potentially harmed by the +5 kVDC signal, or the tester 20 could be harmed by accidental contact of the TEST signal with the bus lines L1, L2 or L3. Thus, the current limit resistance is separated onto two separate resistors 248 and 82 to provide current limit protection for both outgoing and incoming voltages. This provides an added level of safety.

The junction between the fuse F2 and contact 252 is connected to one side of a calibration resistor 254, having its other side connected to a normally-open test relay contact 256, which has its other side connected to GND. The contact 256 is controlled by a relay coil 376 (FIG. 5), so that while current flows through the coil 376, the contact 256 changes state to closed. If the contact 256 is closed and the contact 252 is open, the TEST output is bypassed with the calibration resistor 254 for calibrating the meter 78, described further below. The collector of an internal, Darlington photo-transistor 251 of the opto-coupler 250 is connected to one side of a resistor 258, having its other side providing a signal $I_P$. The emitter of the transistor 251 is connected to one side of a resistor 262 and to one side of a resistor 260, where the other side of the resistor 260 provides a signal $I_{N1}$. The other side of the resistor 262 is connected to one side of a resistor 264, having its other side providing a signal $I_{N2}$ to the meter circuit 112.

Figure 5:
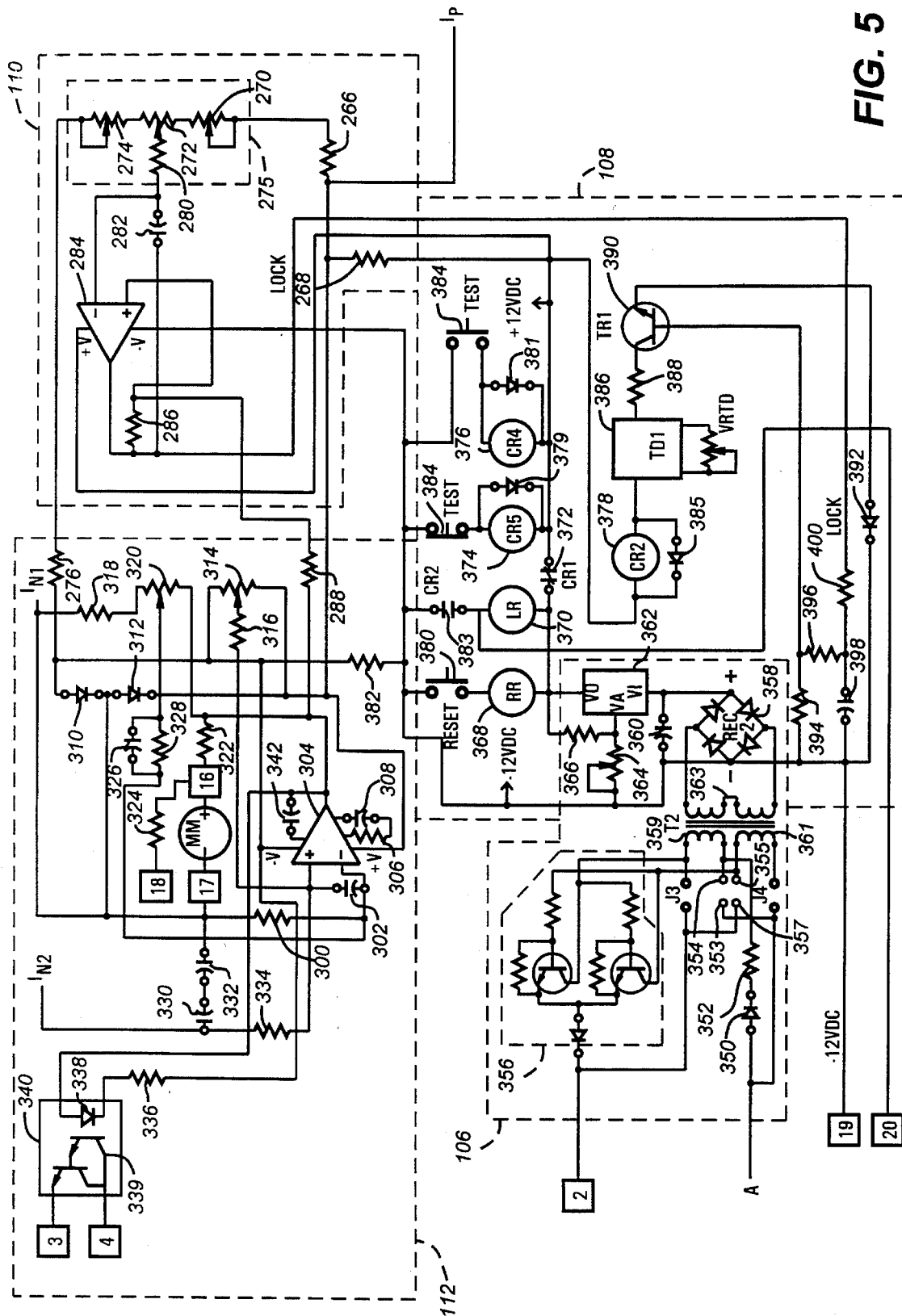
FIG. 5 is a more detailed schematic diagram of the measuring and control portions of the automatic insulation tester of FIG. 1.

Referring now to FIG. 5, a detailed schematic diagram is shown of the control power circuit 106, the lockout circuit 108, the setpoint adjust circuit 110 and the meter circuit 112. The $I_P$ signal is connected to one side of a resistor 266 and to one side of a resistor 268 within the set point adjust circuit 110. The other side of the resistor 266 is connected to one side of a variable resistor 270, having its other side connected to one side of a setpoint potentiometer 272. The other side of the potentiometer 272 is connected to one side of a variable resistor 274, having its other side connected to a resistor 276 within the meter circuit 112. The variable resistors 270, 274 each have adjust controls to vary their resistive values. An adjust contact of the potentiometer 272 is connected to one side of a resistor 280, having its other side connected to one side of a capacitor 282 and to the inverting input of the comparator 284. The comparator 284 is preferably the SK3564 manufactured by RCA02 or the ECC778 manufactured by Sylvania. The other side of the capacitor 282 is connected to the output of the comparator 284, which is also connected to one side of a feedback resistor 286, having its other side connected to the non-inverting input of the comparator 284 and to one side of a resistor 288.

The output of the comparator 284 provides a signal LOCK, which is provided to the lockout circuitry 108 described more fully below. In general, the opto-coupler 250 senses the current through the insulation of the motor 22, and provides sense output signals $I_P$, $I_{N1}$ and $I_{N2}$ to the set-point adjust circuit 110 and the meter circuit 112. The control terminals of the variable resistors 270, 274 and the potentiometer 272 are used to determine the highest amount of leakage current allowed through the insulation of the motor 22 corresponding to the lowest desired insulation resistance. Once the insulation resistance drops below the predetermined low resistance value, the comparator 284 asserts the LOCK signal high.

The $I_{N1}$ signal is connected to terminal 17 of the tester 20, which is also connected to the negative terminal of the meter 78. Terminal 17 is also connected to one side of a resistor 300, having its other side connected to one side of a capacitor 302 and to the inverting input of an operational amplifier (OP AMP) 304. The OP AMP 304 is preferably the ECG 909 manufactured by Sylvania. The other side of the capacitor 302 is connected to the non-inverting input of the OP AMP 304. A resistor 306 and a capacitor 308 are connected in series between the input frequency compensation terminals of the OP AMP 304. Terminal 17 is also connected to the cathode of a diode 310 and to the anode of a diode 312. The anode of the diode 310 is connected to the other side of the resistor 276 and the cathode of diode 312 is connected to the positive voltage supply terminal of OP AMP 304. The anode of the diode 310 is also connected to the negative voltage supply terminal of OP AMP 304 and to one side of a potentiometer 314, having its other side connected to the cathode of the diode 312. The adjust contact of the potentiometer 314 is connected to one side of a resistor 316, having its other side connected to the non-inverting input of OP AMP 304.

The $I_{N1}$ signal is also connected to one side of a resistor 318, having its other side connected to the one side of a potentiometer 320, having its other side connected to one side of a resistor 322, to the output of the OP AMP 304 and to the second side of the resistor 288. The other side of the resistor 322 is connected to terminal 16 of the tester 20, which is also connected to the positive terminal of the meter 78 and to one side of a resistor 324. The other side of the resistor 324 is connected to terminal 18 of the tester 20. The adjust contact of the potentiometer 320 is connected to one side of a capacitor 326 and to one side of a resistor 328, where the other side of the capacitor 326 and the resistor 328 are connected together and connected to the inverting input terminal of the OP AMP 304.

The $I_{N2}$ signal is connected to one side of a capacitor 330 and to one side of a resistor 334, where the other side of the capacitor 330 is connected to one side of a capacitor 332 and the other side of the resistor 334 is connected to the non-inverting input terminal of the OP AMP 304. The other side of the capacitor 332 is connected to terminal 17 of the tester 20. The negative voltage supply terminal of OP AMP 304 is connected to one side of a resistor 336, which has its other side connected to the cathode of a LED 338 within an opto-coupler 340. The anode of the LED 338 is connected to the output terminal of the OP AMP 304 and to one side of a capacitor 342, where the other side of the capacitor 342 is connected to the output frequency compensation terminal of the OP AMP 304. The collector of a Darlington phototransistor 339 internal to the opto-coupler 340 is connected to terminal 4 and the emitter of the transistor 339 is connected to terminal 3 of the tester 20. Thus, terminals 3 and 4 of the tester 20 provide a milliamp (mA) output for external control circuitry to monitor the output voltage of the tester 20. The OP AMP 304 drives the meter 78 and the opto-coupler 340 at its output terminal.

The signal A is connected to the anode of a diode 350, having its cathode connected to one side of a resistor 352. The A signal is essentially the same signal applied to terminal 1 of the tester 20, separated by the diode 114 and the fuse 116. The other side of the resistor 352 is connected to a terminal 354 and to one side of a first primary coil 359 of a transformer T2. The A signal is also connected to a terminal 353, and to one side of an optional jumper J4, having its other side connected to one side of a second primary coil 361 of the transformer T2. The other side of the second primary coil 361 is connected to a terminal 355. Terminal 2 of the tester 20 is connected to a terminal 357 and to one side of an optional jumper J3, having its other side connected to the other side of the first primary coil 359 of the transformer T2. In this manner, the terminals 353, 354, 355 and 357 may be used to switch between 120 and 240 volts AC provided between terminals 1 and 2 of the tester 20, or the AC transformer T2 may be bypassed with jumpers J3 and J4 if a DC voltage of 24 volts is provided between terminals 1 and 2.

An optional oscillator circuit 356 is connected to the primary coils 359, 361 of D.C. transformer T2 and to terminal 2 of the tester 20, to form a switching power supply if a DC voltage of 24 volts is supplied between terminals 1 and 2 of the tester 20. The secondary coil 363 of the transformer T2 is connected across the input terminals of a fullwave rectifier bridge 358, which operates in a similar manner as the rectifier 132. A capacitor 360 is provided between the positive and negative output terminals of the rectifier 358. The positive output terminal of the rectifier 358 provides a signal +12 VDC, which is provided to the input of a three terminal voltage regulator 362. The negative output terminal of the rectifier 358 provides a -12 VDC signal provided to terminal 19 of the tester 20. The +12 VDC and -12 VDC signals are used to provide power for all the control circuitry of the tester 20. The -12 VDC signal is provided to one side of a variable resistor 364, having its other side connected to the adjust terminal of the regulator 362. A feedback resistor 366 is provided between the adjust and output terminals of the regulator 362. The variable resistor 364 has an adjust control to calibrate the output of the regulator 362.

The +12 VDC signal is connected to one side of a reset relay coil 368, to one side of the mechanical latching relay coil 370 and also to one side of a normally-closed relay contact 372, which is controlled by the coil 120. The contacts 85, 86, 87, 88 and contacts 152, 154 are controlled by the latching relay coil 370 and the release relay coil 368. The coil 370, when activated, serves to switch the state of the contacts 85, 86, 87, 88 from that shown in FIG. 1 and to switch the state of contacts 152 and 154 from that shown in FIG. 3. The contacts 85–88 and 152 and 154 are latching contacts, so that a momentary impulse of current through the coil 370 changes their state. The contacts 85–88 and 152, 154 remain latched in their changed state even while current no longer flows through the coil 370. However, a momentary impulse of current through release relay coil 318 changes the state of the contacts 85–88, 152, 154 back to that shown in the Figures.

The other side of the contact 372 is connected to one side of the relay coil 374, to one side of the test coil 376, to the other side of the resistor 268, to pin 8 of the comparator 284 and to one side of a coil 378. The other side of the reset coil 368 is connected to one side of a normally-open reset switch 380, having its other side connected to the -12 VDC signal. The -12 VDC signal is connected to one side of a resistor 382 of the meter circuit 112, where the other side of the resistor 382 is connected to pin 4 of OP AMP 304. Also, the -12 VDC signal is connected to one side of a normally-open relay contact 383, having its other side connected to the other side of the latching coil 370 and to terminal 20 of the tester 20.

The -12 VDC signal is connected to one pole of a normally-open two pole portion of a test switch 384, and to the ground terminal of the comparator 284. The second pole of the normally open portion of the test switch 384 is connected to the other side of the test coil 376. One pole of a normally-closed two pole portion of the test switch 384 is connected to the ground terminal of the comparator 284, with the other pole being connected to the other side of coil 374. Diodes 379, 381 and 385 are placed in parallel across the coils 374, 378 and 376, respectively, as known to those skilled in the art. The other side of the coil 378 is connected to one side of a time delay coil 386, having its other side connected to one side of a resistor 388. The other side of the resistor 388 is connected to the collector of an NPN bipolar transistor 390, having its emitter connected to the anode of a diode 392, which has its cathode connected to the -12 VDC signal. The base of transistor 390 is connected to one side of a resistor 394 and to one side of another resistor 396, where the other side of the resistor 394 is connected to the -12 VDC signal and the other side of the resistor 396 is connected to one side of a filter capacitor 398 and to one side of a resistor 400. The other side of the capacitor 398 is connected to the -12 VDC signal. The other side of the resistor 400 receives the LOCK signal from the set point adjust circuit 110.

An additional comparator essentially in parallel with comparator 284 and set to a different set point just above that of the comparator 284 can be used to provide a pre-alarm or early warning signal. The additional comparator can drive an additional relay coil to provide a pre-alarm contact output to provide a warning before motor operation is disabled by comparator 284.

While the motor 22 is not operating, the coil 120 is de-activated so that the relay contacts 118, 152 and 372 are closed. The tester 20 provides a relatively stable and very high voltage of preferably approximately 5 kV on the TEST signal output on line 80. The yellow LED 164 receives current from the low voltage power supply 100 and is illuminated, indicating normal test operation. The tester 20 measures the resistance of the insulation of windings 26, 28 and 30 by measuring the current flowing from the TEST signal to its ground input through the opto-coupler 250, where this current is approximately equal to the current flowing from windings 26, 28 and 30 to the chassis 24 of the motor 22. The value of the insulation resistance is displayed by the meter 78. Typically, the meter 78 includes a needle and scale to provide a visual display of the value of the insulation resistance to the operator. By viewing the meter 78, an operator can readily tell whether the resistance of the insulation is sufficiently high, or is getting dangerously low. The operator can take periodic readings from the meter 78 to note any trend showing gradual degradation of the insulation, and, take preventative measures to reinsulate the windings 26, 28 and 30 before the motor 22 malfunctions.

If the value of the insulation resistance drops below a predetermined value, the comparator 284 asserts the LOCK signal high, activating the transistor 390 and the time delay relay coil 386. Once triggered, the time delay coil 386 activates the coil 378, which closes the contact 383. The contact 383 provides the −12 VDC signal to the latching relay coil 370, which is then activated causing several latched conditions. First, the contact 86 is latched open, which locks out the motor starter 54, disabling the motor 22. Second, the contact 152 is latched open, disabling the tester 20 from developing and providing its TEST output. The opening of the contact 152 removes the output of the low-voltage power supply 100 from the LED 162, turning it off. Third, the contact 154 is latched closed, providing power from the low-voltage power supply 100 to illuminate the red LED 158. Fourth, the contact 88 is latched closed, empowering the alarm 76 indicating to the operator that the insulation resistance has dropped below the predetermined value. Also, contacts 85 and 87 latch to changed states, to cause other latched conditions, the description of which are beyond the scope of the present disclosure. Since the contacts 85–88 and 152–154 are latching contacts, they remain in their changed state even if current no longer flows through the coil 370. Thus, the tester 20 remains in a fault condition, even if the value of the insulation resistance rises above the predetermined value.

After the motor 22 is repaired or serviced, the operator can press the reset switch 380 to reset the contacts 85–88 and 152, 154 to the positions shown in the Figures to allow normal testing and operation. To insure that the test reading displayed on the meter 78 is accurate, the operator may press test switch 384 to control relay coils 374 and 376, thereby opening contact 252 and closing contact 256 while the test switch 384 is pressed. Current from the +5 kVDC signal flows through the calibration resistor 254, which has a value to cause the meter 78 to deflect to a predetermined set point (not shown). If the tester 20 is not properly calibrated, the operator can adjust the potentiometer 320, so that the meter 78 reflects the proper calibration.

It can now be appreciated that a high voltage insulation tester according to the present invention provides the ability to safely and accurately test high voltage electrical equipment at approximately 5 kV. A high impedance oscillator drives a highly insulated transformer to boost a low DC voltage to an intermediate sinusoidal voltage level. A multistage voltage multiplier circuit 104 rectifies and multiplies the intermediate sinusoidal voltage to the desired DC high voltage level. The voltage multiplier circuit 104 comprises a multistage diode and capacitor ladder to achieve the high voltage level, while maintaining a low current and load capacity for safe operation. The output voltage of the multistage amplifier collapses if any appreciable amount of current is drawn, reducing its maximum output current to a safe level. Nonetheless, the voltage multiplier circuit 104 maintains its 5 kV output between the TEST and GND signals while testing the insulation resistance of the motor 22 during normal test operations. This properly stresses the insulation resistance to achieve an accurate and reliable test.

The typical current limit resistor is separated into two resistors, providing current limit protection for both outgoing and incoming voltages of the tester. This isolates the user and the tester from the bus line voltages. The voltages and the current through the insulation of the test equipment are monitored indirectly using opto-coupler circuits to protect operators and the low voltage monitoring circuits. Thus, an insulation tester according to the present invention provides for a more accurate and reliable measurement of the insulation resistance of high voltage electrical equipment, while maintaining the necessary safety precautions.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

I claim:

1. An insulation tester for measuring the insulation resistance of a high rated voltage motor or generator, the motor or generator having a chassis and at least one winding, the tester comprising:

a high voltage power supply having a first terminal for coupling to the winding and a second terminal for coupling to the chassis of the motor or generator, said high voltage power supply comprising:

means for generating a voltage signal having an intermediate voltage level; and a voltage multiplier having a plurality of stages for converting said intermediate voltage signal to a high DC output voltage equal to or exceeding the rated voltage of the motor or generator and for providing said high output voltage between said first and second terminals, said voltage multiplier having a limited current capacity wherein said high output voltage collapses towards said intermediate level if a load across said first and second terminals causes the current provided to the load to exceed a predetermined maximum level, wherein said maximum current level is substantially safe for equipment and humans; and sensing means coupled between said first and second terminals for determining the insulation resistance of the motor or generator by measuring the current flowing between said terminals.

2. The insulation tester of claim 1, wherein said intermediate voltage signal generating means comprises:

means for generating a low DC voltage;

a high impedance oscillator having an input and an output, wherein said oscillator input receives said low DC voltage; and a transformer having a primary and a secondary, wherein said primary is coupled to said output of said high impedance oscillator, wherein said oscillator switches said transformer to provide said intermediate voltage at said secondary of said transformer.

3. The insulation tester of claim 2, wherein said transformer is insulated to withstand said high voltage.

4. The insulation tester of claim 3, wherein said high DC output voltage is 5 kV.

5. The insulation tester of claim 1, wherein said voltage multiplier comprises:

a multistage rectifier-capacitor ladder.

6. The insulation tester of claim 5, wherein said multistage rectifier-capacitor ladder comprises:

a first set of capacitors coupled in series;

a second set of capacitors coupled in series; and a set of rectifiers, coupled between said first and second sets of capacitors.

7. The insulation tester of claim 1, wherein said high DC output voltage is 5 kV.

8. The insulation tester of claim 1, further comprising:

a first current limit resistor connected between said high DC output voltage and said first terminal; and a second current limit resistor connected between said first terminal and winding and located near the motor or generator.

* * * * *